United States Patent [19]

Kawakami et al.

[11] Patent Number: 4,900,602
[45] Date of Patent: Feb. 13, 1990

[54] PRINTED WIRING BOARD

[75] Inventors: Shin Kawakami; Satoshi Haruyama; Hirotaka Okonogi; Katsutomo Nikaido; Junichi Ichikawa, all of Saitama, Japan

[73] Assignee: Nippon CMK Corp., Saitama, Japan

[21] Appl. No.: 192,588

[22] Filed: May 9, 1988

[30] Foreign Application Priority Data

Dec. 18, 1987 [JP] Japan .................................. 62-320611

[51] Int. Cl.$^4$ .............................................. B32B 1/04
[52] U.S. Cl. ...................................... 428/76; 428/206; 428/208; 428/209; 428/328; 428/403; 428/408; 428/546; 428/570; 428/901
[58] Field of Search ................. 428/206, 76, 208, 209, 428/328, 403, 408, 546, 570, 901

[56] References Cited

U.S. PATENT DOCUMENTS

| 3,211,584 | 10/1965 | Ehrreich | 428/570 |
| 3,830,656 | 8/1974 | Takenaka et al. | 428/208 |
| 3,846,345 | 11/1974 | Mason et al. | 428/570 |
| 3,907,717 | 9/1975 | Hebert | 252/508 |
| 4,286,250 | 8/1981 | Sacchetti | 219/552 |
| 4,511,524 | 4/1985 | Nemeth et al. | 264/61 |

Primary Examiner—Ellis P. Robinson
Assistant Examiner—P. J. Ryan
Attorney, Agent, or Firm—Bruce L. Adams; Van C. Wilks

[57] ABSTRACT

The invention relates to a printed wiring board (7) which includes at least one carbon resistor (3) formed across terminals (2a, 2b) of printed wiring circuit (2). A heat dissipating film layer (4) is formed at least on the carbon resistor (3). Thus, heat produced in the resistor (3) is effectively dissipated.

8 Claims, 1 Drawing Sheet

PRINTED WIRING BOARD

TECHNICAL FIELD TO WHICH THE INVENTION RELATES

The present invention relates to a printed wiring board.

DESCRIPTION OF THE PRIOR ART

As one conventional method of mounting a desired resistor across printed wiring circuits, a carbon resistor is mounted by printing across printed wiring circuit terminals. This method is widely adopted to simplify the mounting operation of resistors on the printed wiring board, and to enable a small size printed wiring board.

On the circuit conductor of thus formed printed wiring board is covered an overcoat formed by printed insulating film.

DISADVANTAGES OF THE PRIOR ART

Such a conventional printed wiring board of the above described construction includes disadvantage such that heat produced during operation in the carbon resistor and circuit conductor can not sufficiently dissipate owing to the insulation film which acts as effective electrical and thermal insulation to the resistor and circuit conductor. Consequently, the resistor and a portion of the circuit conductor may be overheated to cause thermal noise which is main cause of erroneous operation.

TECHNICAL PROBLEM

The object of the present invention is to eliminate or at least mitigate the above mentioned disadvantage and to provide an improved printed wiring board which effectively prevents the resistor and circuit conductor from producing thermal noise and from erronneous operation in the circuit.

SOLUTION OF THE TECHNICAL PROBLEM

A heat dissipating film layer covers at least the carbon resistor.

Preferably, the heat dissipating film layer is formed by a printed film layer.

Preferably, the heat dissipating film layer is formed by a film layer which is formed paste-like ink which is made from copper particles coated by silver and is formed by printing process.

Preferably, the heat dissipating film layer is formed on an overcoat film layer which covers the carbon resistor.

ADVANTAGEOUS EFFECT OF THE INVENTION

The printed wiring board, according to the present invention performs a positive heat dissipating effect by the heat dissipating film layer formed on the carbon resistor so that heat produced in the carbon resistor while operation of the printed wiring board can be dissipated effectively even when the insulating overcoat film covers the carbon resistor.

DETAILED DESCRIPTION OF THE PRIOR ART AND OF THE PREFERRED EMBODIMENT

Figure 2:
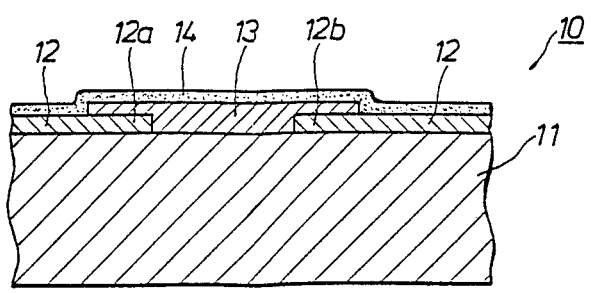
FIG. 2 is an enlarged sectional view of a portion of a conventional printed wiring board.

FIG. 2 shows a conventional printed wiring board 10 which includes a base plate or substrate 11 made of insulating material, a printed wiring circuit 12 formed on the base plate 11, terminals 12a and 12b of the circuit 12, a carbon resistor 13 across the terminals 12a and 12b and formed by a printing process of carbon paste, and an electrically insulative overcoat film layer 14 formed by printing process of an insulating paste and covering the circuit 12 and the carbon resistor 13. The disadvantages of this structure have been disclosed above.

Now, one preferred embodiment of the printed wiring board according to the present invention will be described referring to the drawing.

Figure 1:
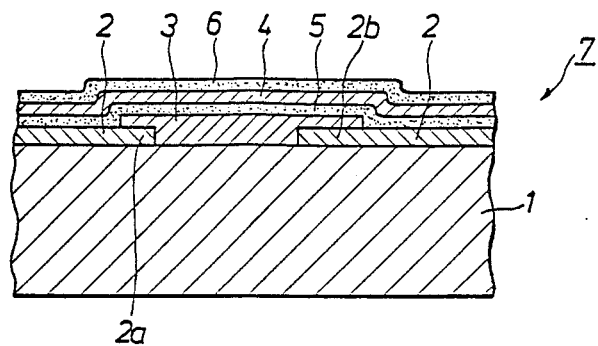
FIG. 1 is an enlarged sectional view of a portion of a printed wiring board according to one embodiment of the present invention.

Referring to FIG. 1 which shows one embodiment of the present invention, a base plate or substrate 1 made from insulating material and having a pair of opposed major surfaces has a desired printed wiring circuit 2 formed on one major surface of the base plate 1. A carbon resistor 3 is formed across the terminals 2a and 2b of the printed wiring circuit 2. The carbon resistor 3 is made from suitable carbon paste ink of desired composition and is formed by a printing process in the region between the terminals 2a and 2b, and then is hardened. The printed wiring circuit 2 and the carbon resistor 3 are completely covered by an electrically insulative overcoat film layer 5 which is similar to the overcoat film layer 14 and is formed by a printing process.

A heat-dissipating film layer 4 completely covers the carbon resistor 3 and the printing wiring circuit 2 through the overcoat film layer 5, according to the present invention.

The heat-dissipating film layer 4 may preferably be made from heat-dissipating paste ink, e.g. heat-conductive copper particles which are sold from Fujikura Kasei Co. Ltd. as Silver compound copper paste EX-019. The paste is formed, in the same manner as the carbon resistor 3 across the terminals by a printing process and is hardened.

The heat-dissipating film layer 4 may be of another composition other than the above mentioned composition to attain heat dissipating effect to the heat produced from the carbon resistor 3.

An electrically insulative overcoat film layer 6, similar to the overcoat film layer 5, is formed on the heat-dissipating film layer 4.

As described, the printed wiring board 7, according to the present invention, positively dissipates heat energy produced in the carbon resistor 3 across the circuit terminals 2a and 2b during operation so that thermal noise by heat and errouneous operation in the circuit 2 are prevented. Thus, a printed wiring board having superior characteristic is provided.

What is claimed is:

1. A printed wiring board comprising: a substrate composed of electrically insulative material and having a pair of opposed major surfaces; a printed wiring circuit printed on one major surface of the substrate and having two spaced-apart wiring terminals; a carbon-containing resistor formed on the one major surface of the substrate in the region between the two spaced-apart wiring terminals, the resistor being in electrical contact with the two wiring terminals; an electrically insulative film layer disposed on and completely covering the two wiring terminals and the resistor; and a heat-dissipating film layer disposed on and completely covering the electrically insulative film layer at least in the region where the electrically insulative film layer covers the two wiring terminals and the resistor to effectively dissipate heat energy produced in the resistor during use of the printed wiring board.

2. A printed wiring board according to claim 1; including another electrically insulative film layer disposed on and covering the heat-dissipating film layer.

3. A printed wiring board according to claim 2; wherein the heat-dissipating film layer comprises a printed film layer.

4. A printed wiring board according to claim 2; wherein the heat-dissipating film layer comprises a hardened paste film layer containing heat-conductive particles.

5. A printed wiring board according to claim 4; wherein the heat-conductive particles comprise copper particles coated with silver.

6. A printed wiring board according to claim 1; wherein the heat-dissipating film layer comprises a printed film layer.

7. A printed wiring board according to claim 1; wherein the heat-dissipating film layer comprises a hardened paste film layer containing heat-conductive particles.

8. A printed wiring board according to claim 7; wherein the heat-conductive particles comprise copper particles coated with silver.

* * * * *